United States Patent [19]

Kurosawa et al.

[11] 4,307,346
[45] Dec. 22, 1981

[54] PHASE DETECTING CIRCUIT

[75] Inventors: Ryoichi Kurosawa, Tokyo; Syunichi Hirose, Fuchu, both of Japan

[73] Assignee: Tokyo Shibaura Denki Kabushiki Kaisha, Kawasaki, Japan

[21] Appl. No.: 66,655

[22] Filed: Aug. 15, 1979

[30] Foreign Application Priority Data

Sep. 1, 1978 [JP] Japan ............................. 53/107368

[51] Int. Cl.³ .......................................... G01R 25/04
[52] U.S. Cl. ................................. 328/155; 323/241; 328/133; 324/83 FE
[58] Field of Search ................ 328/133, 155; 323/217, 323/241; 324/83 FE, 86; 361/244; 307/262

[56] References Cited

U.S. PATENT DOCUMENTS

| | | | |
|---|---|---|---|
| 3,953,794 | 4/1976 | Moore | 328/133 X |
| 3,956,623 | 5/1976 | Clark et al. | 328/133 X |
| 4,001,680 | 1/1977 | Bylund et al. | 328/133 X |
| 4,063,146 | 12/1977 | Oliver | 328/155 X |

FOREIGN PATENT DOCUMENTS 53-22249 7/1978 Japan.

OTHER PUBLICATIONS

Floter et al., *Field-Oriented Closed-Loop Control of Induction Machine with New Transvektor Control System,* Siemens Review XXXIX, No. 6 (1972), pp. 248–252.

*Primary Examiner*—Eugene R. LaRoche
*Attorney, Agent, or Firm*—Oblon, Fisher, Spivak, McClelland & Maier

[57] ABSTRACT

Disclosed is a phase detecting circuit having first and second sets of two-phase sine wave signals each set of which has phases different from each other by 90°, an arithmetic operation circuit for detecting a phase difference between the two-phase sine wave signals, and a frequency variable signal generating circuit for producing an output pulse with a frequency varying in accordance with the sum of proportional and integrated values of an output signal from the arithmetic operation circuit. The phases of the sine wave signals are so changed as to minimize the phase difference. The phase detecting circuit is provided with a function generating circuit which counts the output pulses from the frequency variable signal generating circuit and produces the second set of two-phase sine wave signals with phases different from each other by 90° whose phases are changed on the basis of the count data.

8 Claims, 4 Drawing Figures

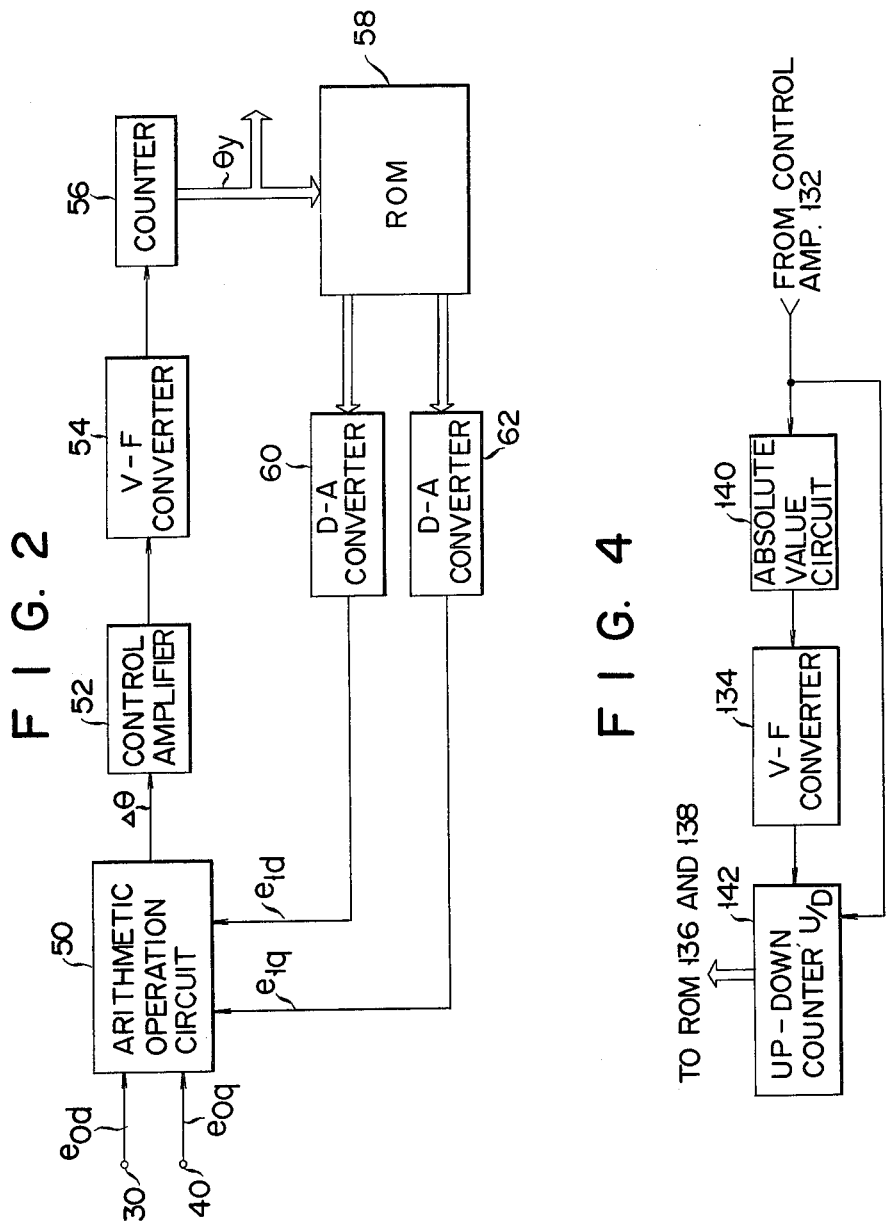

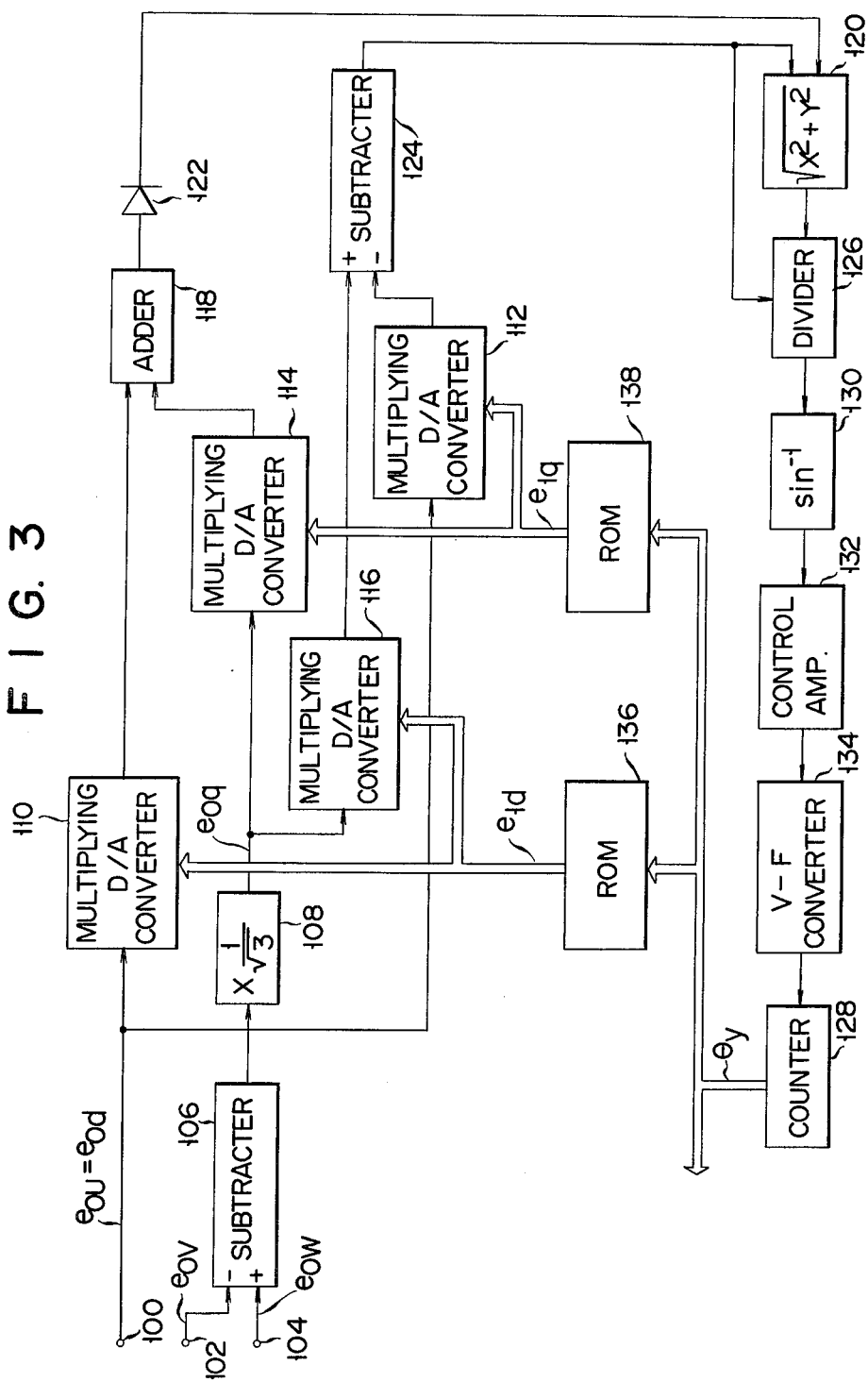

PHASE DETECTING CIRCUIT

BACKGROUND OF THE INVENTION

The present invention relates to a phase detecting circuit for producing a digital phase signal varying with a frequency variation or a phase variation of a two-phase or polyphase AC signal.

In a thyristor phase control type power converter, it is necessary to properly control a firing phase of the thyristor in accordance with the phase of power source voltage. In order to effect such control using digital IC technique, it is required to digitally detect a phase of an AC signal for energizing the thyristor. In case where it is expected that the frequency of an output signal greatly varies as in the case of the dynamotor, a rapid phase control is further required.

A phase detecting circuit including a phase locked loop (PLL) has generally been used for such a digital phase detection. FIG. 1 shows a phase detection circuit for digitally detecting a phase of a three-phase AC signal widely used in the thyristor phase control type power converter.

In the phase detecting circuit shown in FIG. 1, three-phase AC signals S1U, S1V and S1W of 50 Hz are applied to wave shapers 2, 4 and 6 where these signals are converted into rectangular wave signals and then applied to first terminals of comparators 8, 10 and 12. As will be described later, those comparators 8, 10 and 12 receive at the second terminals rectangular wave signals with phases different from one another by 120° and produces rectangular wave signals of 100 Hz including DC components proportional to phase differences between the input signals received at the first and second terminals. The output terminals produced from the comparators 8, 10 and 12 are summed in an adder 14 and then the adder 14 produces an output signal of 300 Hz. The output signal from the adder 14 is applied to a low-pass filter 18 where it is converted into a DC signal proportional to a phase difference between the input signals applied to the first and second input terminals of each comparator 8, 10 and 12. The DC signal from the low-pass filter 18 is supplied to a voltage-frequency converter 16. The voltage-frequency converter 16 produces pulses at a rate corresponding to the input DC signal. The output pulse from the voltage frequency converter 16 is frequency-divided into a signal of 300 Hz by a counter circuit 20 and the 300 Hz signal is then applied to a 6-scale counter circuit 22. A decoder 24 decodes the contents of the counter circuit 22 and supplies rectangular wave signals S2U, S2V and S2W of about 50 Hz with phases different from one another by 120° which are in synchronism with the output pulse from the converter 16 to the second input terminals of the comparators 8, 10 and 12. The contents of the counter circuits 20 and 22 are used to form phase data $\theta1$ representing a rectangular wave signal generated from the decoder 24.

In the phase detecting circuit shown in FIG. 1, so long as the three-phase AC signals S1U, S1V and S1W are respectively synchronized with the three-phase rectangular wave signals S2U, S2V and S2W, the converter 16 produces pulses with given frequencies (equal to the frequency division ratio of the counter 20×6×50 Hz) so that the decoder 24 may continuously produce the output signals S2U, S2V and S2W in phase with the three-phase AC signals S1U, S1V and S1W. Under this condition, if the phase of the three-phase AC signal is brought in advance of that of the three-phase rectangular wave signal from the decoder 24, the comparators 8, 10 and 12 produce output signals containing larger DC components and the V-F converter 16 produces an output pulse with a higher frequency. As a result, the counter 22 operates at a higher speed and the decoder 24 produces three-phase rectangular wave signals S2U, S2V and S2W phase-advanced. In this way, three-phase rectangular wave signals S2U, S2V and S2W are controlled to be substantially always in phase with the three-phase AC signals S1U, S1V and S1W and phase data $\theta1$ representing the phase of the three-phase rectangular wave signals S2U, S2V and S2W is always taken out from the counters 20 and 22.

In the circuit shown in FIG. 1, when the low-pass filter 18 is formed to have proportion and integration function or PI function, it is possible to change the phases of the three-phase rectangular wave signals following phase changes of the three-phase AC signals S1U, S1V and S1W without significant delay.

The phase detecting circuit shown in FIG. 1 has the following disadvantages. The first is that the constructions of wave shapers 2, 4 and 6 are complicated. The input three-phase AC signals S1U, S1V and S1W are sine wave signals including a noise component and distortion component. Accordingly, when such sine wave signals are wave-shaped, those signals are susceptible to the noise and the distortion. In order to remove the influence of the noise and the distortion, the three-phase AC signal is filtered out and then is wave-shaped. Since the phase of the three-phase AC signal fed through the filter is delayed and particularly an amount of the phase delay changes according to a frequency change of the three-phase AC signal, the phase detecting signal will contain a phase difference corresponding to the frequency change, even if the PLL properly operates. The compensation for the phase difference needs a complex circuit for detecting the frequency of the three-phase AC signal to control the amount of phase delay corresponding to the frequency change.

Since the comparators 8, 10 and 12 compares phases of the rectangular wave signals, the phase comparison is performed for each 180° phase angle. Accordingly, even when three comparators are used, the phase comparison is made for every 60° phase angle. In other words, the circuit fails to detect a phase change occurring within the phase angle 60°.

The adder 14 produces an output signal with the frequency six times those of the three-phase AC signals S1U, S1V and S1W. Such an output signal is applied to the low-pass filter 18. Therefore, a proper phase detection is impossible for a phase variation arising at a rate higher than the frequency six times that of the three-phase AC signal.

Particularly, when the frequency of the three-phase AC signal is low, it is impossible to set an in-phase condition at a high speed.

SUMMARY OF THE INVENTION

Accordingly, an object of the invention is to provide a phase detecting circuit capable of quickly detecting a phase change of an input signal.

According to one aspect of the invention, there is provided a phase detecting circuit comprising: an arithmetic operation circuit having first and second input terminals for receiving two-phase AC signals in a specified phase relationship and third and fourth input terminals for receiving two-phase AC signal, and producing an output signal corresponding to a phase difference between the two-phase AC signals received at the first and second input terminals and those at the third and fourth input terminals; a frequency variable signal generating means for producing an output signal with a frequency varying in accordance with the output signal from the arithmetic operation circuit; counting means for counting the output signal from the frequency variable signal generating means; and a function generating means which responds to the count data from the counting means to apply two-phase AC signals in the specified phase relationship, wherein count data representing the phase of the two-phase AC signals to be applied to the third and fourth input terminals of the arithmetic operation circuit are obtained from the counting means.

Other objects and features of the invention will be apparent from the following description taken in connection with the accompanying drawings, in which:

BRIEF DESCRIPTION OF THE DRAWINGS

FIG. 2 shows in block form a principle of a phase detecting circuit according to the invention;

FIG. 3 shows a block diagram of a phase detecting circuit which is an embodiment according to the invention; and FIG. 4 shows a modification of part of the phase detecting circuit shown in FIG. 3.

DETAILED DESCRIPTION OF THE PREFERRED EMBODIMENTS

Figure 1:
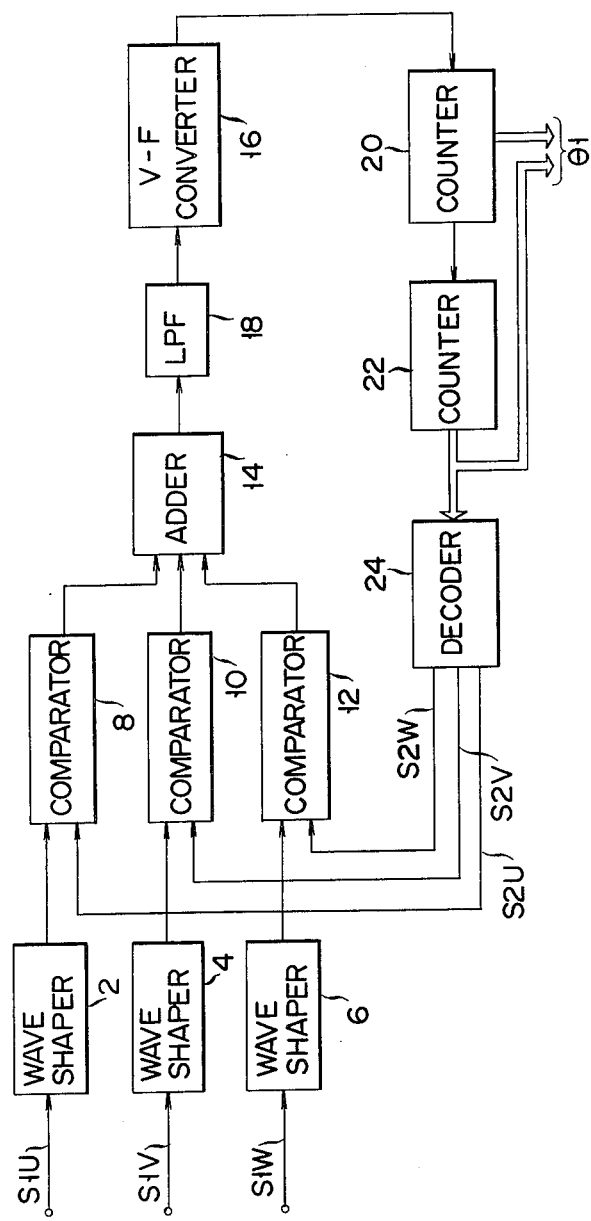
FIG. 1 shows a block diagram of a conventional phase detecting circuit.

Explanation will first be given of an embodiment of a phase detecting circuit in accordance with the invention with reference to the drawings.

Two-phase sine wave signals $e_{od}$ and $e_{oq}$ with amplitudes Eo and with phases different from each other by 90° are expressed by the following equations $$e_{od} = E_o \cos \theta_x$$

$$e_{oq} = E_o \sin \theta_x$$

where $\theta_x$ denotes the phase of the signals $e_{od}$ and $e_{oq}$. Similarly, two-phase sine wave signals $e_{ld}$ and $e_{lq}$ with unit amplitudes and with phases different from each other by 90° are given $$e_{ld} = \cos \theta_y$$

$$e_{lq} = \sin \theta_y$$

where $\theta_y$ denotes the phase of the signals $e_{ld}$ and $e_{lq}$.

Since $E_o \sin (\theta_x - \theta_y) = E_o \sin \theta_x \cos \theta_y - E_o \cos \theta_x \sin \theta_y$ and $E_o^2 = (E_o \cos \theta_x)^2 + (E_o \sin \theta_x)^2$, the phase difference $\Delta\theta (= \theta_x - \theta_y)$ between the two sets of two-phase sine wave signals is given as follows:

$$\Delta\theta = \sin^{-1}\left( \frac{e_{oq} \cdot e_{ld} - e_{od} \cdot e_{lq}}{\sqrt{e_{oq}^2 + e_{oq}^2}} \right) \quad (1)$$

The phase difference $\Delta\theta$ between the two sets of the two-phase sine wave signals can be continuously obtained by using the equation (1). By controlling phase $\theta_y$ of the two-phase wave signals $e_{ld}$ and $e_{lq}$ with the unit amplitudes to make small the phase difference $\Delta\theta$ obtained by solving the equation (1), the two sine wave signals $e_{ld}$ and $e_{lq}$ with the unit amplitudes can be made to immediately follow the two-phase sine wave signals $e_{od}$ and $e_{oq}$, which are input signals.

FIG. 2 schematically shows a phase detecting circuit according to the invention. The phase detecting circuit shown in FIG. 2 receives the two-phase sine wave signals $e_{od}$ and $e_{oq}$ at the input terminals 30 and 40. Those input signals $e_{od}$ and $e_{oq}$ are supplied to an arithmetic operation circuit 50, together with two-phase sine wave signals $e_{ld}$ and $e_{lq}$ with unit amplitudes. The arithmetic operation circuit 50 processes according to the equation (1) the input signals $e_{od}$ and $e_{oq}$ and the unit amplitude signals $e_{ld}$ and $e_{lq}$, thereby to produce an output signal representative of the phase difference $\Delta\theta$. The output signal $\Delta\theta$ from the arithmetic operation circuit 50 is applied to a proportion and integration type control amplifier 52. The control amplifier 52 has a noise filter function, for example. The control amplifier 52 produces an output signal having a voltage level corresponding to the sum of proportional value and integrated value of the phase difference $\Delta\theta$ or a voltage level defined by the phase difference $\Delta\theta$ and frequency variations of the two-phase sine wave signals $e_{ld}$ and $e_{lq}$. The output signal from the control amplifier 52 is applied to a voltage frequency converter 54 to control the frequency of an output pulse from the converter 54. A counter 56 of $2^n$-scale type or n bit-binary counter counts the output pulse from the counter 54 to produce an n-bit output signal representing the phase $\theta_y$ of the two-phase sine wave signals $e_{ld}$ and $e_{lq}$ with the unit amplitudes. The n-bit output data $\theta_y$ from the counter 56 is applied to an external control circuit (not shown) and also to a read only memory (ROM) 58. Upon receipt of the n-bit address signal from the counter 56, the ROM 58 produces digital signals corresponding to the two-phase sine wave signals $e_{ld}$ ($=\cos \theta_y$) and $e_{lq}$ ($=\sin \theta_y$) with 90°-phase difference. The two signals read out from the ROM 58 are respectively transferred to digital-analog converters 60 and 62 where these signals are converted into the two-phase sine wave signals $e_{ld}$ and $e_{lq}$ with unit amplitudes which are in turn transferred to the arithmetic operation circuit.

When the input signals $e_{od}$ and $e_{oq}$ and the two-phase sine wave signals $e_{ld}$ and $e_{lq}$ are in phase, the phase difference $\Delta\theta$ is zero. At this time, the control amplifier 52 produces an output signal with a voltage level corresponding to a frequency $f_s$ of the two-phase sine wave signals $e_{ld}$ and $e_{lq}$ being now applied to the arithmetic operation circuit 50. In response to an output signal from the control amplifier 52, the V-F converter 54 supplies an output signal with a frequency ($f_s \times 2^n$) to the $2^n$-scale counter 56. The counter 56 produces an n-bit output signal representing the phase $\theta_y$ of the two-phase sine wave signals $e_{ld}$ and $e_{lq}$ and supplies the same to the ROM 58. As a result, the ROM 58 produces digital signals corresponding to $\cos \theta_y$ and $\sin \theta_y$, and supplies them to the respective D-A converters 60 and 62 where these signals are converted to the two-phase sine wave signals $e_{ld}$ and $e_{lq}$ which are respectively in synchronism with the input sine wave signals $e_{od}$ and $e_{oq}$. These converted signals are then applied to the arithmetic operation circuit 50.

When the input signals $e_{od}$ and $e_{oq}$ are in phase-advance of the two phase sine wave signals $e_{ld}$ and $e_{lq}$, the arithmetic operation circuit 50 produces a phase difference signal $\Delta\theta$. At that time, a voltage level of an output signal from the control amplifier 52 increases by the voltage level corresponding to the phase difference signal $\Delta\theta$, so that the V-F converter 54 produces an output pulse with higher frequency. As a consequence, the counter 56 speeds up in its counting operation and the ROM 58 is addressed at a shorter interval, so that digital data are read out at a shorter interval from the ROM 58 and the phase of the two-phase wave signals $e_{ld}$ and $e_{lq}$ are advanced. In this way, the two-phase wave signals $e_{ld}$ and $e_{lq}$ are brought in synchronism with the input signals $e_{od}$ and $e_{oq}$, and the phase difference signal $\Delta\theta$ from the arithmetic operation circuit 50 becomes zero.

Similarly, when the input signals $e_{od}$ and $e_{oq}$ are delayed behind the two-phase sine wave signals $e_{ld}$ and $e_{lq}$, the phase of the two-phase sine wave signals $e_{ld}$ and $e_{lq}$ is changed so as to make the phase difference signal $\Delta\theta$ zero.

FIG. 3 illustrates an embodiment of a phase detecting circuit in accordance with the invention and is constructed on the basis of the concept discussed relating to FIG. 2.

The phase detecting circuit shown in FIG. 3 receives three-phase AC signals $e_{ou}$, $e_{ov}$ and $e_{ow}$ at the input terminals 100, 102 and 104, respectively. The input signals $e_{ov}$ and $e_{ow}$ are applied to a subtractor 106 of which the output signal is multiplied by $$\frac{1}{\sqrt{3}}$$

times in a coefficient multiplier 108. The input signal $e_{ou}$ and the output signal from the coefficient multiplier 108, respectively, are used as sine waves $e_{od}(=\cos\theta_x)$ a $e_{oq}(=\sin\theta_x)$ with 90° phase difference. The sine wave signal $e_{od}$ is applied to analog input terminals of a multiplying D/A converters 110 and 112 with multiplication and D-A conversion functions. Those circuits may be constructed by using IC, AD7530 manufactured in ANALOG DEVICES INC., for example. The sine wave signal $e_{oq}$, namely, the output signal from the coefficient multiplier 108, is applied to the first terminals of the multiplying D/A converters 114 and 116. Output signals from the multiplying D/A converters 110 and 114 are added to each other in an adder 118 whose output signal is applied through a diode 122 to the first input terminal of a root-mean-square-sum circuit 120. An output signal from the multiplying D/A converter 112 is subtracted from an output signal of the multiplying D/A converter 116 in a subtractor 124 and the result is supplied to a second input terminal of the root-mean-square-sum circuit 120. An output signal from the root-mean-square-sum circuit 120 is applied to one input terminal of a divider 126 which receives an output signal from the subtractor 124 of the other input terminal. An output signal from the divider 126 is applied to a counter 128, through an inverse trigonometrical function circuit 130, a control amplifier 132 and a V-F converter 134. The count data from the counter 128 is applied as an output signal to an external control circuit (not shown) and also to ROMs 136 and 138. Digital data read out from the ROM is applied to digital input terminals of the multiplying D/A converters 110 and 116 as the two-phase sine wave signal $e_{ld}$ with a unit amplitude. On the other hand, the digital data from the ROM 138 is applied to digital input terminals of the multiplying D/A converters 112 and 114 as the two-phase sine wave signal $e_{lq}$ with a unit amplitude.

The multiplying D/A converter 110 produces an output signal ($E_o \cos\theta_x \cos\theta_y$) corresponding to the product of the analog sine wave signal $e_{od}$ and the digital sine wave signal $e_{ld}$; the multiplying D/A converter 112 an analog output signal ($E_o \cos\theta_x \sin\theta_y$) corresponding to the product of the analog sine wave signal $e_{od}$ and the digital sine wave signal $e_{lq}$; the multiplying D/A converter 114 an output signal ($E_o \sin\theta_x \sin\theta_y$) corresponding to the product of the analog sine wave signal $e_{oq}$ and the digital sine wave signal $e_{lq}$; the multiplying D/A converter 116 an analog output signal ($E_o \sin\theta_x \cos\theta_y$) corresponding to the product of the analog sine wave signal $e_{oq}$ and the digital sine wave signal $e_{ld}$. Output signals from the converter 110 and 114 are processed in the adder 118, which then produces an output signal ($E_o \cos\Delta\theta$). On the other hand, output signals from the converters 112 and 116 are processed in the subtractor 124, which then produces an output signal ($E_o \sin\Delta\theta$). The root-mean-square-sum circuit 120 receives an output signal from the adder 118 through the diode 122 and also reveives an output signal from the subtractor 124 to produce an output signal ($E_o$). The divider 126 divides an output signal from the subtractor 124 by an output signal from the root-mean-square-sum circuit 120 and then supplies an output signal ($\sin\Delta\theta$) to the inverse trigonometrical function generator 130 which produces a phase difference signal ($\Delta\theta$). As in the principle circuit shown in FIG. 2, the phase difference signal ($\Delta\theta$) from the function generator is processed in the control amplifier 132, the V-F converter 134 and the counter 128 and then the ROMs 136 and 138 produce the two-phase signals $e_{ld}(=\cos\theta)$ and $e_{lq}(=\sin\theta_x)$ with 90°-different phases.

While the invention has been described in its preferred embodiments, it is to be understood that various modifications may be made therein. For example, in the phase detecting circuit shown in FIG. 3, the diode 122 is necessarily used because the root-means-square-sum circuit 120 is constructed by using the IC, 4302 of BUR BROWN INC. The diode 122, however, is omissible in case the root-mean-square-sum circuit capable of producing an output signal representing a root-mean-square-sum irrespective of the polarity of the input signal. In the above-mentioned embodiments, though the amplitude $E_o$ is obtained from the signals $E_o \cos\Delta\theta$ and $E_o \sin\Delta\theta$, it can be directly obtained from the input signals $e_{od}$ and $e_{oq}$ as is explained in the principle circuit of FIG. 2. At this time, it is possible to omit the converters 110 and 114, the adder 118 and the diode 122. Moreover, in case the amplitudes of the input signals $e_{od}$ and $e_{oq}$ are substantially constant, the output signal from the subtractor 124 may be directly applied to the inverse trigonometrical function circuit 130, with omission of the converters 110 and 114, the adder 118, the diode 122, the root-mean-square-sum circuit 120 and the divider 126. The inverse trigonometrical function generator 130 may be omitted when the phases of the input signals $e_{od}$ and $e_{oq}$ do not abruptly change since the phase difference $\Delta\theta$ is controlled to have a small value and $\sin\Delta\theta \doteq \Delta\theta$.

In a further modification, as shown in FIG. 4, an absolute value circuit is coupled between the control amplifier 132 and the V-F converter 134, and the counter 128 is replaced with an up-down counter 142. The up-down counting modes of the counter 142 are set in accordance with a porality of the output signal from the control amplifier 132. Therefore, even if the phase relationship between the input signals $e_{od}$ and $e_{oq}$ is reversed, that is, even if the phase $\theta_x$ continuously decreases, the two-phase sine wave signals $e_{ld}$ and $e_{lq}$ may be made to accurately follow the input signals $e_{od}$ and $e_{oq}$. Thus, this invention can be applied to an angular position detector such as synchro transmitter which generates a poly-phase sine wave signal corresponding to the rotation phase or rotation angle.

Furthermore, in the circuit shown in FIG. 3, the output signal $E_o$ from the root-mean-square-sum circuit 120 may be used for an external circuit as a control signal representative of an amplitude of an input signal. The circuit shown in FIG. 3 may also be used as a frequency multiplying circuit since the V-F converter 134 produces a pulse signal with the multiplied frequencies of the input signals $e_{od}$ and $e_{oq}$. Additionally, the FIG. 3 circuit forms 90°-differenct phase sine wave signals by using the ROMs 136 and 138; however, it is possible to use a single ROM storing tregonometrical function and alternately designated by an address signal $\theta_y$ from the counter 128 and an address signal $$\left(\theta_y + \frac{\pi}{2}\right)$$

so that the ROM can supply two-phase sine wave signals with 90° phase difference. In this case, single component microcomputer 8048 from INTEL Co. can be used to effect data processing with respect to the single ROM.

What we claim is:

1. A phase detecting circuit comprising:
   an arithmetic operation circuit having first and second input terminals for receiving two-phase AC signals in a specified phase relationship and third and fourth input terminals for receiving two-phase AC signals, and producing an output signal corresponding to a phase difference between the two-phase AC signals received at the first and second terminals and those at the third and fourth input terminals;
   frequency variable signal generating means for producing an output signal with a frequency varying in accordance with the output signal from said arithmetic operation circuit;
   counting means for counting the output signal from said frequency variable signal generating means; and
   function generating means supplying two-phase AC signals in the specified phase relationship to the third and fourth input terminals of said arithmetic operation circuit, in response to the count data from said counting means;
   wherein count data from said counting means represents digitally the phases of the two-phase AC signals applied to the third and fourth input terminals of said arithmetic operating circuit, and the frequency of the output signal from said signal generating means changes in accordance with the output signal from said arithmetic operation circuit to decrease the phase difference.

2. A phase detecting circuit according to claim 1, wherein both the two-phase AC signals applied to the first and second input terminals of said arithmetic operating circuit and those applied to the third and fourth input terminals are two-phase sine wave signals different by 90° of phase from each other.

3. A phase detecting circuit according to claim 1, wherein said frequency variable signal generating means includes a control circuit connected to said arithmetic operating circuit to produce an output signal with a voltage level determined by an output signal from said arithmetic operating circuit and an amount of phase or frequency change of the two-phase AC signals applied to the third and fourth input terminals of said arithmetic operating circuit, and a voltage-frequency converting circuit for applying an output signal with a frequency corresponding to the voltage level of the output signal from said control circuit.

4. A phase detecting circuit according claim 3, wherein said control circuit is proportion and integrating type control amplifier.

5. A phase detecting circuit according to any one of claims 1 to 4, wherein said function generating means includes a storage circuit which receives count data from said counting means as an address signal and produces the two-phase sine wave signals different by 90° of phase from each other.

6. A phase detecting circuit according to claim 5, wherein said arithmetic operating circuit includes a first multiplier for producing an output signal corresponding to the product of input signals received at the first and third input terminals, a second multiplier for producing an output signal corresponding to the product of input signal received at the second and fourth input terminals, a subtractor which makes a subtraction between output signals received at the second and fourth input terminals and applies the output signal to said frequency variable signal generating means.

7. A phase detecting circuit according to claim 5, wherein said storage circuit is a read only memory.

8. A phase detecting circuit according to claim 1 or 2, wherein said frequency variable signal generating means includes a control circuit which is connected to said arithmetic operating circuit and which generates an output signal with a voltage level determined by an output signal from said arithmetic operation circuit and an amount of a phase or frequency change of the two-phase AC signals applied to the third and fourth input terminals of said arithmetic operation circuit, an absolute value circuit which is connected to said control circuit and which generates an output signal corresponding to an absolute value of the output signal from said control circuit, a voltage-frequency converting circuit for applying an output signal with a frequency corresponding to voltage level of the output signal from said absolute value circuit to said counting means, and said counting means includes an up-down counter selectively set to an up or down counting mode according to the polarity of the output signals from said control circuit.

* * * * *